US012652752B2

(12) United States Patent
Huang et al.

(10) Patent No.: US 12,652,752 B2
(45) Date of Patent: Jun. 9, 2026

(54) CIRCUIT BOARD DEVICE

(71) Applicant: UNIMICRON TECHNOLOGY CORP., Taoyuan City (TW)

(72) Inventors: Chun-Jui Huang, Taoyuan City (TW); Chen-Yang Tseng, Taoyuan City (TW); Yi-Pen Lin, Taoyuan City (TW); Wei-Yu Liao, Taoyuan City (TW); Chi-Min Chang, Taoyuan City (TW); Ching-Sheng Chen, Taoyuan City (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 276 days.

(21) Appl. No.: 18/656,999

(22) Filed: May 7, 2024

(65) Prior Publication Data

US 2025/0287497 A1 Sep. 11, 2025

(30) Foreign Application Priority Data

Mar. 11, 2024 (TW) ................................. 113108801

(51) Int. Cl.
H05K 1/02 (2006.01)
H01P 3/06 (2006.01)
H05K 1/11 (2006.01)

(52) U.S. Cl.
CPC .............. H05K 1/025 (2013.01); H01P 3/06 (2013.01); H05K 1/115 (2013.01)

(58) Field of Classification Search
CPC .......... H05K 1/0251; H05K 1/115; H01P 3/06
See application file for complete search history.

(56) References Cited

FOREIGN PATENT DOCUMENTS

| | | |
|---|---|---|
| TW | 201531192 A | 8/2015 |
| TW | 202335545 A | 9/2023 |
| TW | 202335559 A | 9/2023 |
| WO | WO 2021/140664 A1 | 7/2021 |

*Primary Examiner* — Jeremy C Norris
(74) *Attorney, Agent, or Firm* — Birch, Stewart, Kolasch & Birch, LLP

(57) ABSTRACT

A circuit board device for transmitting signals at a frequency of 50 GHz to 300 GHz is provided. The circuit board device includes an insulating portion, first and second interlayer conduction structures passing through the insulating portion, a first reference layer, and a second reference layer. The first interlayer conduction structure defines a signal path and includes a first pillar including first end portions and a first central section. The first thickness of the first end portions is greater than the second thickness of the first central section. The first and second reference layers are located on top and bottom surfaces of the insulating portion and surround the first interlayer conduction structure. Two opposite second end surfaces of the second interlayer conduction structure are respectively connected to the first reference layer and the second reference layer to define a ground path surrounding the signal path.

29 Claims, 12 Drawing Sheets

CIRCUIT BOARD DEVICE

CROSS REFERENCE TO RELATED APPLICATIONS

This application claims priority of Taiwan Patent Application No. 113108801, filed on Mar. 11, 2024, the entirety of which is incorporated by reference herein.

BACKGROUND OF THE INVENTION

Field of the Invention

The present invention relates to a circuit board device, in particular to an interlayer connective structure of a circuit board device.

Description of the Related Art

With the rapid development of electronic devices, circuit boards in electronic devices need to quickly transmit current signals at higher frequencies. However, when current flows through the interlayer connective structure in the circuit board, the current signal may be affected by characteristic differences, such as the structure or interfaces of the interlayer connective structure. Several problems can occur, such as impedance mismatch, high reflection loss and high insertion loss, thereby affecting the integrity of high-frequency signals. In order to comply with the current development trend of electronic devices, the signal transmission quality of the conventional circuit boards must be improved.

BRIEF SUMMARY OF THE INVENTION

An embodiment of the present invention provides a circuit board device for transmitting signals at a frequency of 50 GHz to 300 GHz. The circuit board device includes an insulation portion, a first interlayer connective structure, a first reference layer, a second reference layer, and at least one second interlayer connective structure. The insulation portion has a top surface and a bottom surface. The first interlayer connective structure passes through the insulation portion and defines a signal path. The first interlayer connective structure includes a first pillar. The first pillar passes through the insulation portion and has two opposite first end surfaces. The first pillar includes a pair of first end portions and a first central section. The pair of first end portions include the respective first end surfaces. The first central section is connected between the first end portions. The first wall thickness of each of the first end portions is greater than a second wall thickness of the first central section. The first reference layer is located on the top surface of the insulation portion. The first reference layer is separated from the first interlayer connective structure and surrounds the first interlayer connective structure. The second reference layer is located on the bottom surface of the insulation portion. The second reference layer is separated from the first interlayer connective structure, and surrounds the first interlayer connective structure. The second interlayer connective structure passes through the insulation portion. Two opposite second end surfaces of the second interlayer connective structure are respectively connected to the first reference layer and the second reference layer to define a ground path that surrounds the signal path. An upper surface and a lower surface of the circuit board device include the respective first end surfaces.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
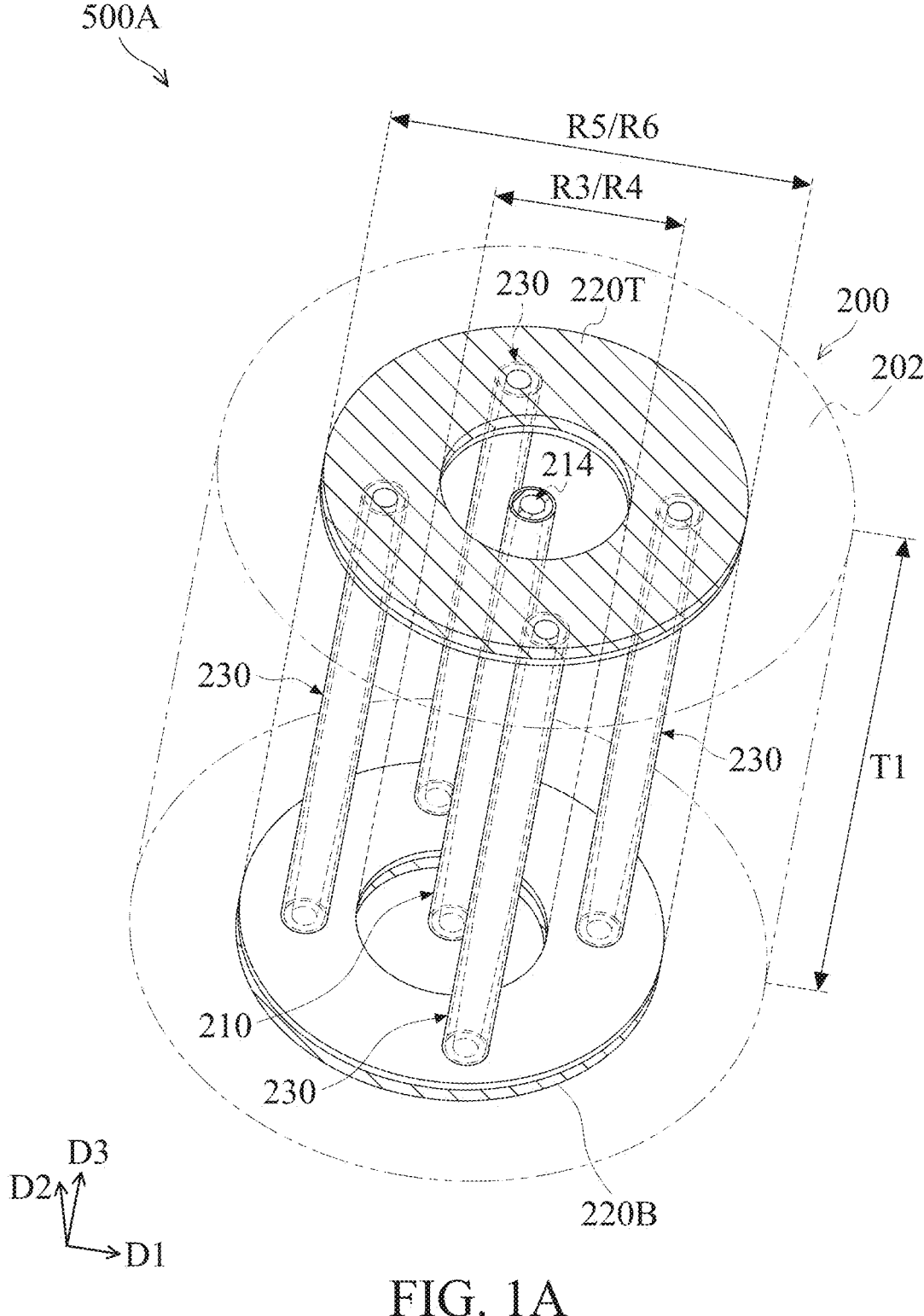
FIG. 1A is a schematic perspective view of a circuit board device in accordance with one embodiment of the disclosure, showing the arrangement of an interlayer connective structure of the circuit board device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms mentioned herein, such as "upper", "lower", "left", "right" and the like refer to the orientation depicted in the figures. Accordingly, the spatially relative terms are intended to illustrate and are not intended to be limiting.

In some embodiments of the disclosure, the terms such as "dispose", "connect" and the like refer to arrangement and connection, unless otherwise specified, may refer to embodiments in which the two features are in direct contact, and may also refer to embodiments in which additional features may be located between the two features, such that the twos features may not be in direct contact. The terms refer to arrangement and connection may also include the embodiments in which both structures are movable, or both structures are fixed.

In addition, the terms "first", "second" and the like mentioned in this specification or the claims are used to name different features or to distinguish different embodiments or ranges, and are not used to limit the upper limit or lower limit of the number of features, and are also not intended to limit the order of manufacture or arrangement of feature.

For the purpose of fully understanding the features and advantages of the disclosure, the subsequent specific embodiments of the disclosure are described in detail with references made to the accompanying drawings.

Figure 1B:
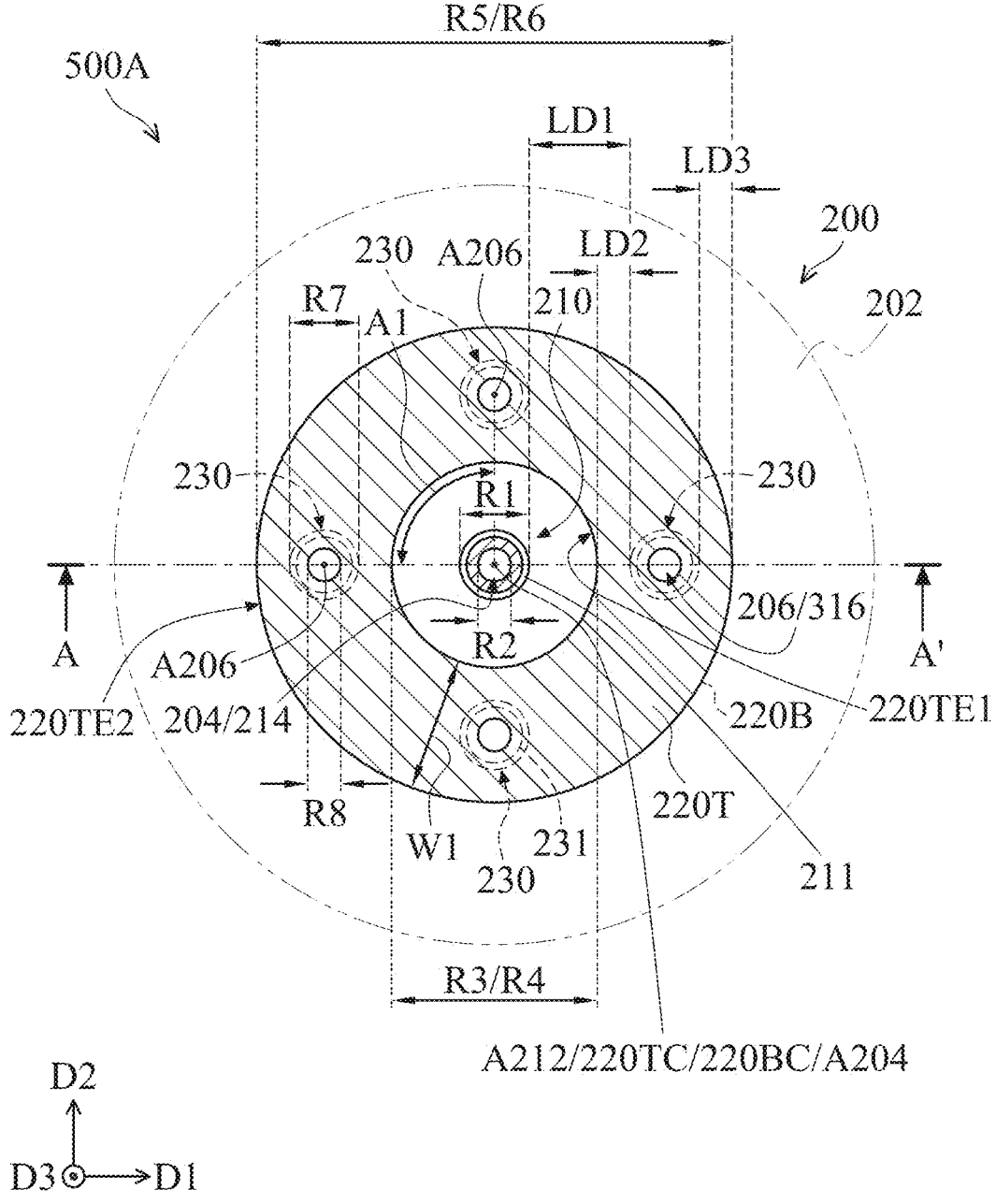
FIG. 1B is a schematic top view of the circuit board device of FIG. 1A, showing a schematic top view of an interlayer connective structure of a circuit board device in accordance with one embodiment of the disclosure.
Figure 1C:
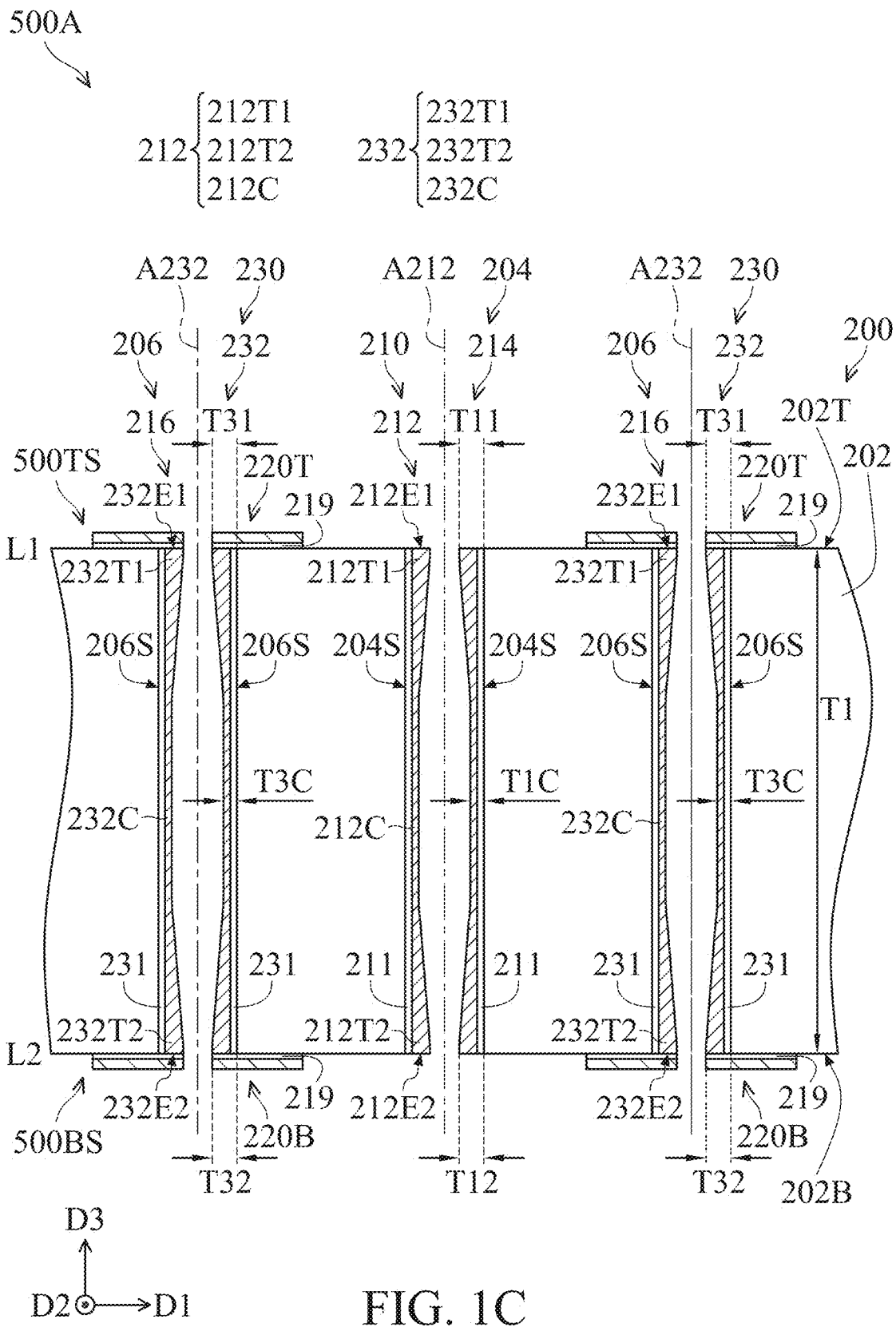
FIG. 1C is a schematic cross-sectional view along line A-A' of the circuit board device of FIG. 1A, showing a schematic cross-sectional view of an interlayer connective structure of a circuit board device in accordance with one embodiment of the disclosure.

FIG. 1A is a schematic perspective view of a circuit board device 500A in accordance with one embodiment of the disclosure, showing the arrangement of a first interlayer connective structure 210 and a second interlayer connective structure 230 of the circuit board device 500A. FIG. 1B is a schematic top view of the circuit board device 500A of FIG. 1A, showing a schematic top view of the first interlayer connective structure 210 and the second interlayer connective structure 230 of the circuit board device 500A in accordance with one embodiment of the disclosure. FIG. 1C is a schematic cross-sectional view along line A-A' of the circuit board device 500A of FIG. 1A, showing a schematic cross-sectional view of the first interlayer connective structure 210 and the second interlayer connective structure 230 of the circuit board device 500A in accordance with one embodiment of the disclosure. In some embodiments, the circuit board device 500A includes a printed circuit board for transmitting signals at a frequency of 50 GHz to 300 GHz. Moreover, the first interlayer connective structure 210 for transmitting signals has a pad-free design.

As shown in FIGS. 1A, 1B, and 1C, for illustration, the circuit board device 500A is a double-sided printed circuit board as an example, in which from the topmost layer to the bottommost layer are respectively marked with a level L1 and a level L2 in sequence. Furthermore, each level may include at least one wiring layer. However, the disclosure may also be applied to other printed circuit board devices with different numbers of layers. Moreover, directions D1 and D2 labeled in FIGS. 1A, 1B and 1C are defined as the horizontal directions (the directions D1 and D2 also serve as the extending directions of the conductive lines/transmission lines), and a direction D3 is defined as the vertical direction (or the extending direction of the plating through hole).

In some embodiments, the circuit board device 500A includes a substrate 200, the first interlayer connective structure 210, a reference layer 220T, a reference layer 220B, and the second interlayer connective structure 230. In this embodiment, the first interlayer connective structure 210 of the circuit board device 500A is a plating through hole (PTH) structure having a pad-free design. That is to say, the first interlayer connective structure 210 used for transmitting signals has opposite end surfaces exposed from the substrate 200. The opposite end surfaces are not directly covered by or directly connected to pads. In addition, the through via 214 of the first interlayer connective structure 210 is not sealed by pads. For illustration, the substrate 200 in FIGS. 1A and 1B is shown with a dotted line.

In some embodiments as shown in FIGS. 1A, 1B, and 1C, the substrate 200 may include an insulation portion 202 and conductive layers (not shown) located at the level L1 and the level L2. For example, the conductive layer located at the level L1 includes a reference layer 220T and a wiring layer (not shown) located on the top surface 202T of the insulation portion 202. The conductive layer located at level L2 includes a reference layer 220B and another wiring layer (not shown) located on the bottom surface 202B of the insulation portion 202. Moreover, the insulation portion 202 is located between the reference layer 220T, the reference layer 220B and the two wiring layers.

In other embodiments, the substrate 200 may include a multilayer printed circuit board and have more than two wiring layers, in which at least one wiring layer may be located within the insulation portion 202. More specifically, the insulation portion 202 may include multiple insulating layers stacked on each other (not shown), and at least one wiring layer may be sandwiched between adjacent two insulating layers.

In some embodiments, the insulation portion 202 may be or may include prepreg (PP) containing polymer materials, fiber materials, or other suitable materials. However, the disclosure is not limited to the disclosed embodiments. For example, the polymer material may be or include epoxy resin, polyimide (PI), other suitable polymer materials or a combination thereof. However, the disclosure is not limited to the disclosed embodiments. The fiber material may include carbon fiber, glass fiber, other suitable fiber materials or a combination thereof. However, the disclosure is not limited to the disclosed embodiments. In this embodiment, the insulation portion 202 may be formed of prepreg (PP), such as EM-890K material from Elite Material Co., Ltd. In some embodiments, a thickness T1 of the insulation portion 202 may be in a range of 2.09 mm to 2.29 mm, such as about 2.19 mm.

The first interlayer connective structure 210 is formed passing through the insulation portion 202 and defines a signal path of the circuit board device 500A. In other words, the first interlayer connective structure 210 is used to transmit signals. In some embodiments, the first interlayer connective structure 210 includes a first pillar 212. More specifically, the first interlayer connective structure 210 is located in the through hole 204 passing through the insulation portion 202. Moreover, the first pillar 212 covers and is in contact with an inner wall 204S of the through hole 204.

The through hole 204 has a diameter R1 (which may also serve as the outer diameter of the first pillar 212). In some embodiments, the diameter R1 is in a range of 100 μm to 200 μm, such as about 150 μm.

As shown in FIG. 1C, the first pillar 212 has two opposite first end surfaces 212E1 and 212E2. Furthermore, the first end surfaces 212E1 and 212E2 are respectively close to the top surface 202T and the bottom surface 202B of the insulation portion 202. In this embodiment, the first interlayer connective structure 210 may be hollow. More specifically, the first pillar 212 may have a tubular shape and have a through via 214. The through via 214 and the through hole 204 may be substantially coaxial. In addition, the axes of the through via 214 and the through hole 204 may overlap the first pillar axis A212 of the first pillar 212. In some embodiments, the first pillar 212 includes a pair of first end portions 212T1, 212T2 and a first central section 212C. The first end portions 212T1 and 212T2 are respectively close to the top surface 202T and the bottom surface 202B of the insulation portion 202. Furthermore, the first central section 212C is connected between the first end portions 212T1 and 212T2. The first end portions 212T1 and 212T2 respectively have the first end surfaces 212E1 and 212E2.

As shown in FIG. 1B, the tubular first pillar 212 has a first pillar inner diameter R2. In some embodiments, the first pillar inner diameter R2 is in a range of 50 μm to 150 μm, for example, about 100 μm. The outer diameter of the first pillar 212 may be the same as the diameter R1 of the through hole 204. In some embodiments, the outer diameter of the first pillar 212 is in a range of 100 μm to 200 μm, for example, about 150 μm.

It is noted that although, the first interlayer connective structure 210 may be hollow in this embodiment, the first interlayer connective structure 210 may also be solid in other embodiments. More specifically, the first pillar 212 in other embodiments may be a solid pillar without the through via 214. Therefore, the first interlayer connective structure 210 is not limited to be hollow. In addition, in other embodiments, the first interlayer connective structure 210 may also include a filling material that fills up the through via 214, such as ink, silver glue, or copper paste.

In some embodiments, wall thicknesses T11 and T12 of the first end portions 212T1 and 212T2 may be greater than a wall thickness TIC of the first central section 212C. The wall thickness TIC shown in FIG. 1C may be the thinnest wall thickness of the first pillar 212. In other words, the thinnest wall thickness (i.e., the wall thickness TIC shown in FIG. 1C) of the first pillar 212 is located at the first central section 212C. In addition, the wall thicknesses T11 and T12 of the first end portions 212T1 and 212T2 may decrease gradually from the corresponding first end surface 212E1 and 212E2 to the first central section 212C, as shown in FIG. 1C. Therefore, the through via 214 has a non-uniform hole diameter (i.e., the first pillar inner diameter R2). In some embodiments, the minimum value of the wall thicknesses T11, T12 and the wall thickness TIC is, for example, about 25 μm.

In some embodiments, the first interlayer connective structure 210 has a pad-free design, which means that the first pillar 212 has two opposite first end surfaces 212E1 and 212E2 that are not directly covered by or directly connected to the pads. In other words, the opposite upper surface 500TS and the lower surface 500BS of the circuit board device 500A include opposing first end surfaces 212E1 and 212E2 respectively. Also, the through via 214 is not sealed by pads.

The reference layers 220T and 220B (also called as ground layers 220T and 220B) are respectively located on the top surface 202T and the bottom surface 202B of the insulation portion 202. The reference layers 220T and 220B are respectively separated from the first interlayer connective structures 210. In addition, the reference layers 220T and 220B surround a first number of first interlayer connective structures 210 (and the first number is a positive integer). In some embodiments, the first number is equal to 1.

In some embodiments, the reference layers 220T and 220B have the same size and top view shape. For example, the reference layers 220T and 220B may have an annular shape or other similar shapes. The projection (the vertical projection) of the reference layer 220T in the direction D3 (FIGS. 1A and 1C) may completely overlap the reference layer 220B. In other words, in the top view shown in FIG. 1C, the reference layer 220T completely overlaps the reference layer 220B. Moreover, a center 220TC (a center of mass) of mass of the reference layer 220T and a center (a center of mass) 220BC of the reference layer 220B may both overlap the first pillar axis A212 of the first pillar 212 in the top view shown in FIG. 1C.

As shown in FIG. 1A, the reference layers 220T and 220B have reference layer inner diameters R3 and R4, respectively. In some embodiments, the reference layer inner diameters R3 and R4 have the same value as each other. In addition, the reference layer inner diameters R3 and R4 are in a range of 500 μm to 600 μm, for example, about 550 μm.

As shown in FIGS. 1A and 1B, the reference layers 220T and 220B have reference layer outer diameters R5 and R6, respectively. In some embodiments, the reference layer outer diameters R5 and R6 have the same value as each other. In addition, the reference layer outer diameters R5 and R6 are in a range of 1200 μm to 1300 μm, for example, about 1250 μm. In some embodiments, a radial width W1 (W1=0.5*(R5−R3) or W1=0.5*(R6−R4)) of the reference layers 220T and 220B is in a range of 300 μm to 500 μm, for example 350 μm.

As shown in FIGS. 1A, 1B, and 1C, in this embodiment, a plurality of second interlayer connective structures 230 is formed passing through the insulation portion 202. Moreover, each of the second interlayer connective structures 230 has two opposite second end surfaces 232E1 and 232E2. The second end surfaces 232E1 and 232E2 are respectively connected to the reference layers 220T and 220B to define a ground path of the circuit board device 500A. The ground path may surround the signal path defined by the first interlayer connective structure 210. Therefore, the second interlayer connective structure 230 may also be called as a ground plating through hole structure 230. Furthermore, the reference layers 220T and 220B may be both connected to a second number of second interlayer connective structures 230 (and the second number is a positive integer). In some embodiments, the second number is in a range of greater than or equal to 4. In this embodiment, the second number is equal to 4.

In some embodiments, the second interlayer connective structure 230 includes a second pillar 232. Moreover, the second pillar 232 covers and is in contact with an inner wall 206S of the corresponding through hole 206. As shown in FIG. 1B, the through hole 206 has a diameter R7 (which may also serve as the outer diameter of the second pillar 232), which has the same value as the diameter R1 of the through hole 204. In some embodiments, the diameter R7 is in a range of 100 μm to 200 μm, such as about 150 μm.

As shown in FIG. 1B, the through hole 204 is spaced apart from the through hole 206 by a first distance LD1. In some embodiments, the first distance LD1 is in a range of 250 μm to 350 μm, for example, about 300 μm.

In the top view shown in FIG. 1B, the through hole 206 is spaced apart from an inner edge 220TE1 of the reference layer 220T (or an inner edge of the reference layer 220B) by a second distance LD2. In some embodiments, the second distance LD2 is in a range of 50 μm to 150 μm, such as about 100 μm. Moreover, as shown in FIG. 1B, the through hole 206 is spaced apart from an outer edge 220TE2 of the reference layer 220T (or an outer edge of the reference layer 220B) by a third distance LD3. In some embodiments, the second distance LD2 and the third distance LD3 have the same value. For example, the third distance LD3 may be in a range of 50 μm to 150 μm, such as about 100 μm.

In some embodiments, through-hole axes A206 of the through holes 206 are located on a circle whose center is located at a first through-hole axis A204 of the through hole 204. In some embodiments, a central angle A1 between two radii connecting the through-hole axes A206 of the two closest through holes 206 to the through-hole axis A204 of the through hole 204 is less than or equal to 90 degrees. For example, as shown in FIG. 1B, the circuit board device 500A has four through holes 206, and the central angle A1 between two radii connecting the through-hole axes A206 of the two closest through holes 206 to the through-hole axis A204 of the through hole 204 is equal to 90 degrees.

In some embodiments, the first pillar 212 of the first interlayer connective structure 210 and the second pillar 232 of the second interlayer connective structure 230 have the same or similar shape, structure, and size. The second end surfaces 232E1 and 232E2 of the second pillar 232 of the second interlayer connective structure 230 are respectively close to the top surface 202T and the bottom surface 202B of the insulation portion 202. In this embodiment, the second interlayer connective structure 230 may be hollow. More specifically, the second pillar 232 may have a tubular shape and have a through via 216. The through via 216 and the through hole 206 may be substantially coaxial. In addition, the axes of the through via 216 and the through hole 206 may overlap the second pillar axis A232 of the second pillar 232. In some embodiments, the second pillar 232 includes a pair of second end portions 232T1, 232T2 and a second central section 232C. The second end portions 232T1 and 232T2 are respectively close to the top surface 202T and the bottom surface 202B of the insulation portion 202. Furthermore, the second central section 232C is connected between the second end portions 232T1 and 232T2. The second end portions 232T1 and 232T2 respectively have the second end surfaces 232E1 and 232E2.

As shown in FIG. 1B, the tubular second pillar 232 has a second pillar inner diameter R8, which has the same value as the first pillar inner diameter R2 of the first pillar 212. In some embodiments, the second pillar inner diameter R8 is in a range of 50 μm to 150 μm, for example, about 100 μm. The outer diameter of the second pillar 232 may be the same as the diameter R7 of the through hole 206 and may be in a range of 100 μm to 200 μm, for example, about 150 μm.

In some embodiments, wall thicknesses T31 and T32 of the second end portions 232T1 and 232T2 may be greater than a wall thickness T3C of the second central section 232C. The wall thickness T3C shown in FIG. 1C may be the thinnest wall thickness of the second pillar 232. In other words, the thinnest wall thickness (i.e., the wall thickness T3C shown in FIG. 1C) of the second pillar 232 is located at the second central section 232C. In addition, the wall thicknesses T31, T32 of the second end portions 232T1, 232T2 may decrease gradually from the corresponding second end surface 232E1 and 232E2 to the second central section 232C, as shown in FIG. 1C. Therefore, the through via 216 has a non-uniform hole diameter. In some embodiments, the wall thicknesses T31, T32 and the wall thicknesses T11, T12 may have the same thickness. In addition, the wall thickness T3C and the wall thickness TIC may have the same thickness. In some embodiments, the minimum value of the wall thicknesses T31, T32 and the wall thickness T3C is, for example, about 25 μm.

It is noted that although the second interlayer connective structure 230 may be hollow in this embodiment, the second interlayer connective structure 230 may also be solid in other embodiments. More specifically, the second pillar 232 in other embodiments may be a solid pillar without the through via 216. Therefore, the second interlayer connective structure 230 is not limited to be hollow. In addition, in other embodiments, the second interlayer connective structure 230 may also include a filling material that fills up the through via 216, such as ink, silver glue, or copper paste.

In some embodiments, the first interlayer connective structure 210 may further include a seed layer 211 located within the through hole 204. The reference layers 220T and 220B may further include a seed layer 219 between them and the top surface 202T and the bottom surface 202B of the insulation portion 202. The second interlayer connective structure 230 may further include a seed layer 231 located within the through hole 206.

Figure 2:
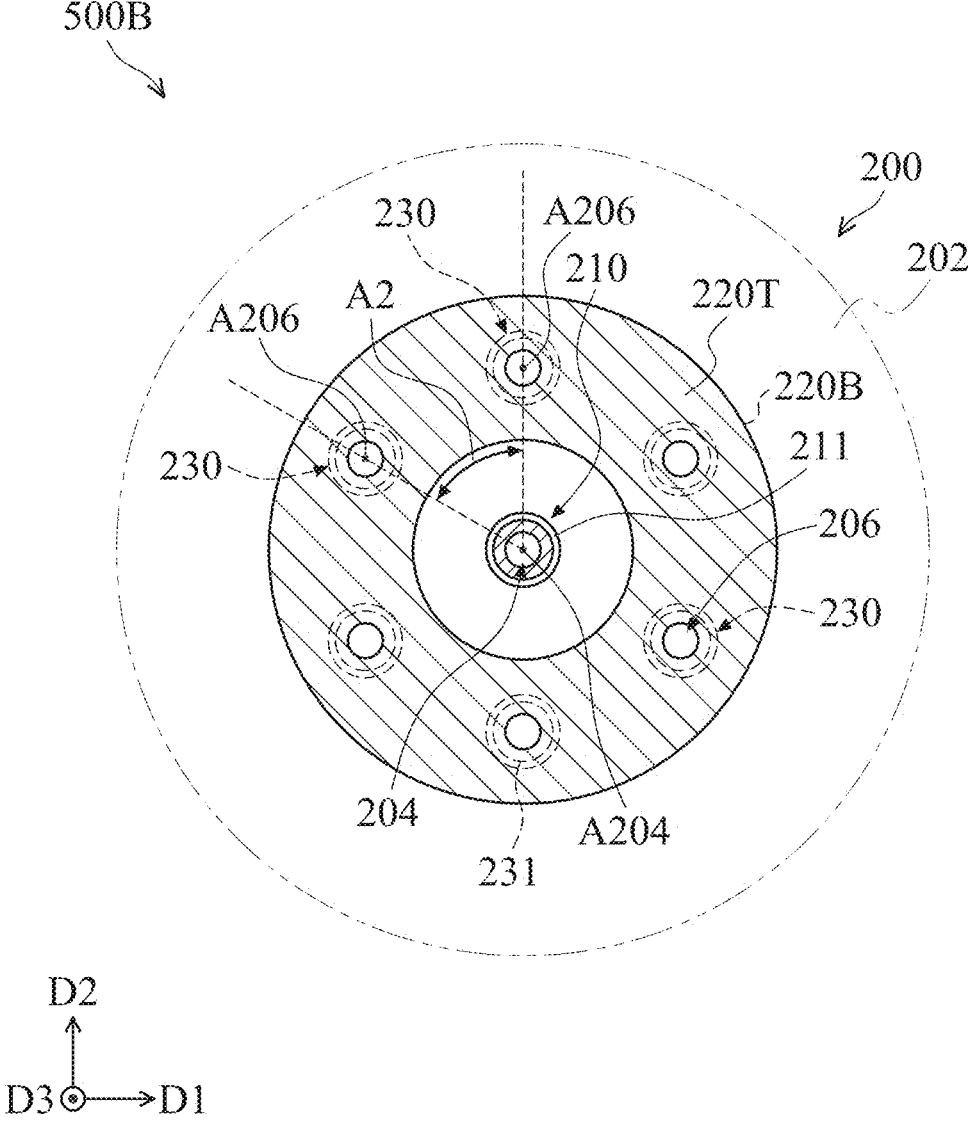
FIG. 2 is a schematic top view of an interlayer connective structure of a circuit board device in accordance with one embodiment of the disclosure.

FIG. 2 is a schematic top view showing the first interlayer connective structure 210 and the second interlayer connective structure 230 of the circuit board device 500B in accordance with one embodiment of the disclosure, and the reference numbers the same or similar as those previously described with reference to FIG. 1 denote the same or similar elements. At least one difference between the circuit board device 500A (FIGS. 1A, 1B and 1C) and the circuit board device 500B (FIG. 2) is that the reference layer 220T and the reference layer 220B of the circuit board device 500B are both connected to 6 second conduction structures 230. As shown in FIG. 2, the central angle A2 between two radii connecting the through-hole axes A206 of the two closest through holes 206 to the through-hole axis A204 of the through hole 204 may be less than or equal to 90 degrees, for example, about 60 degrees.

Figure 3A:
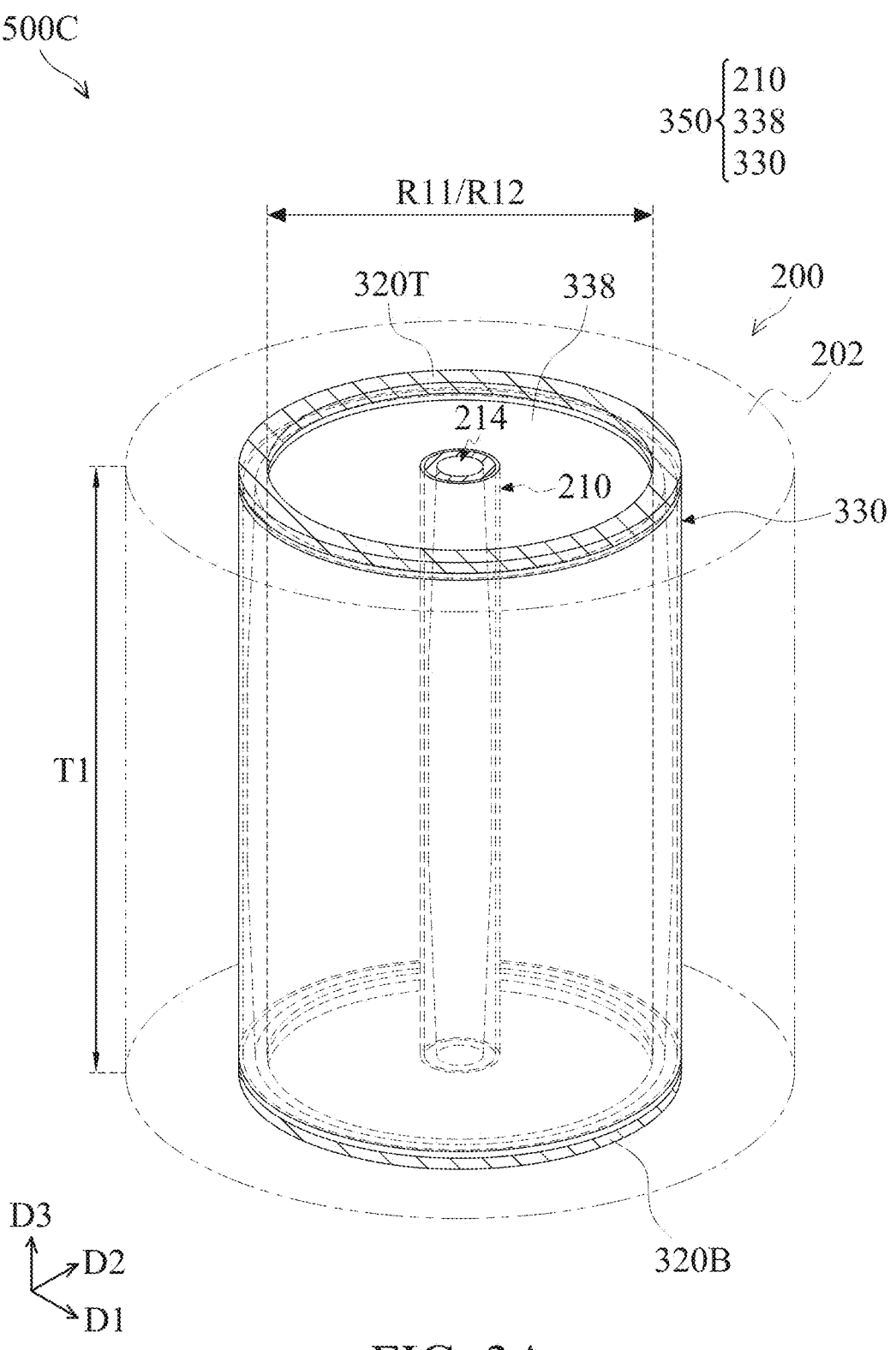
FIG. 3A is a schematic perspective view of a circuit board device in accordance with one embodiment of the disclosure, showing the arrangement of an interlayer connective structure of the circuit board device.
Figure 3B:
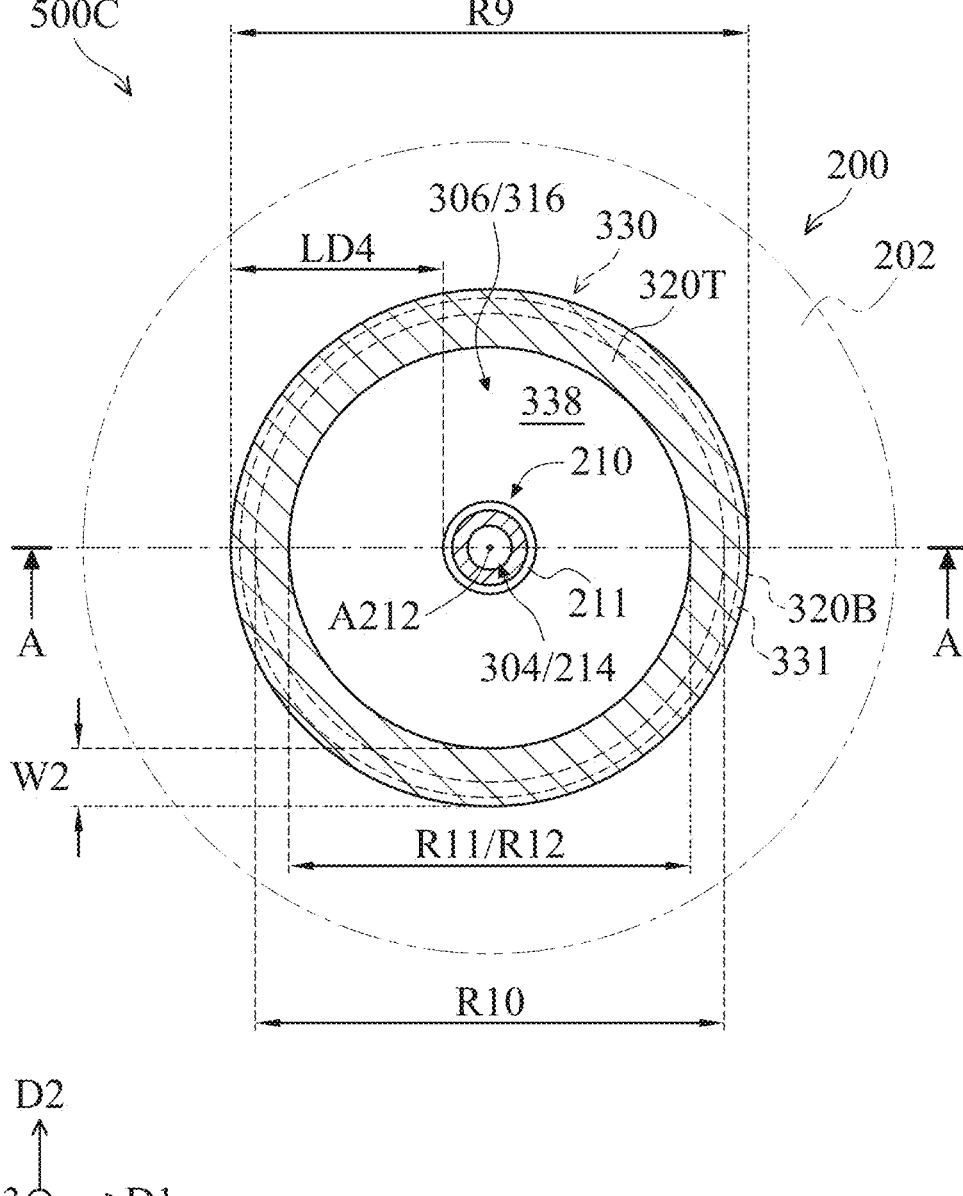
FIG. 3B is a schematic top view of FIG. 3A, showing a schematic top view of an interlayer connective structure of a circuit board device in accordance with one embodiment of the disclosure.
Figure 3C:
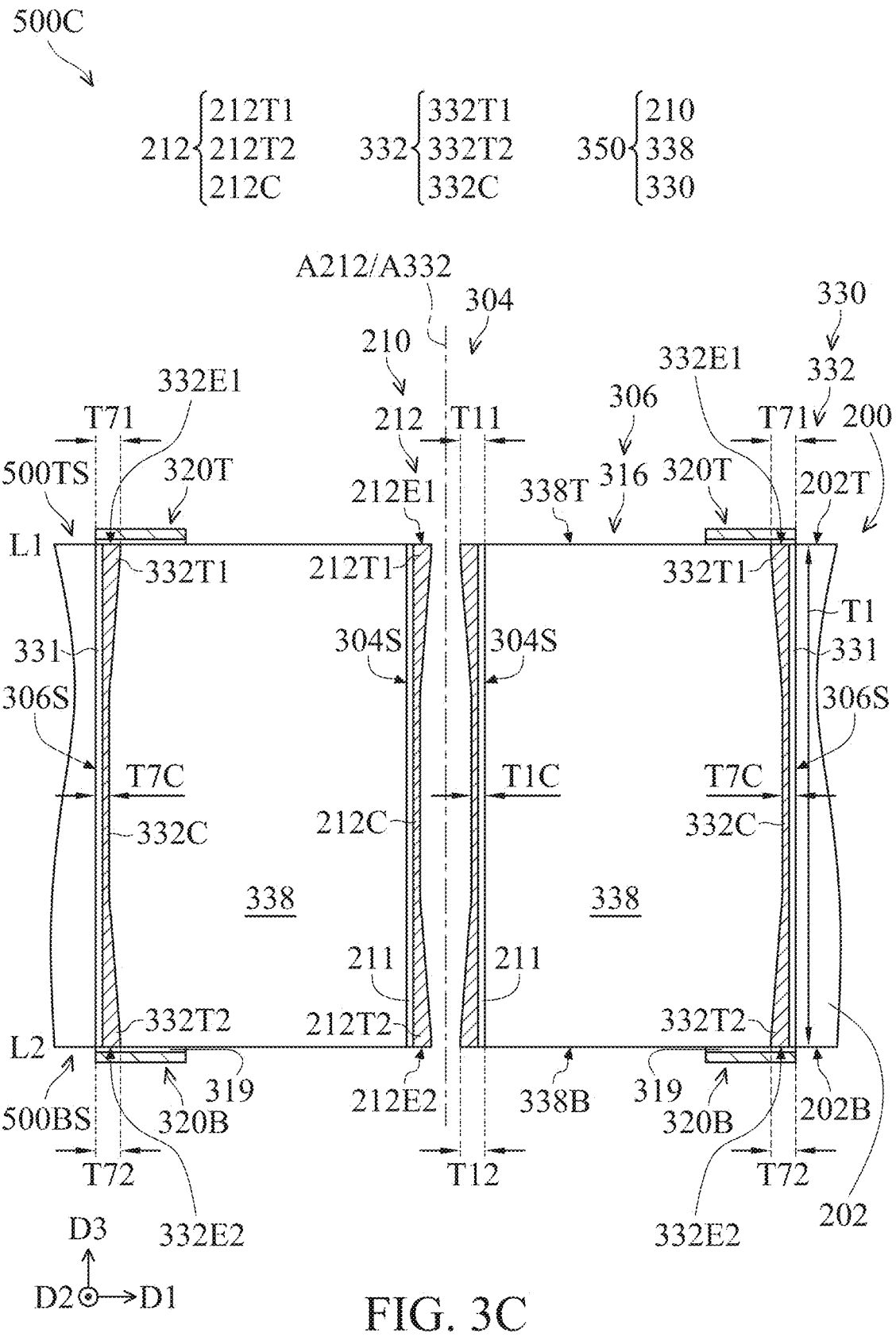
FIG. 3C is a schematic cross-sectional view along line A-A' of the circuit board device of FIG. 3A, showing a schematic cross-sectional view of an interlayer connective structure of a circuit board device in accordance with one embodiment of the disclosure.

FIG. 3A is a schematic perspective view of a circuit board device 500C in accordance with one embodiment of the disclosure, showing the arrangement of the first interlayer connective structure 210 and a second interlayer connective structure 330 of the circuit board device 500C. FIG. 3B is a schematic top view of FIG. 3A, showing a schematic top view of the first interlayer connective structure 210 and the second interlayer connective structure 330 of the circuit board device 500C in accordance with one embodiment of the disclosure. FIG. 3C is a schematic cross-sectional view along line A-A' of the circuit board device 500C of FIG. 3A, showing the first interlayer connective structure 210 and the second interlayer connective structure 330 of the circuit board device 500C in accordance with one embodiment of the disclosure. In FIGS. 3A, 3B, and 3C, the reference numbers the same or similar as those previously described with reference to FIGS. 1A, 1B, 1C, and 2 denote the same or similar elements. At least one difference between the circuit board device 500A (FIGS. 1A, 1B and 1C) (or the circuit board device 500B (FIG. 2)) and the circuit board device 500C is that the circuit board device 500C includes a coaxial via structure 350 formed by the first interlayer connective structure 210 and the second interlayer connective structure 330. Furthermore, the first interlayer connective structure 210 may serve as the inner conductor structure of the coaxial via structure 350. In addition, the second interlayer connective structure 330 surrounding the first interlayer connective structure 210 may serve as the outer conductor structure of the coaxial via structure 350. In some embodiments, the impedance of the coaxial perforated structure 350 is in a range of 45 ohms (52) to 55 ohms, such as about 50.7 ohms. In addition to the first interlayer connective structure 210 and the second interlayer connective structure 330, the coaxial via structure 350 further includes a dielectric material 338 (such as resin, ink, silver glue or copper paste) located between the first interlayer connective structure 210 and the second interlayer connective structure 330.

As shown in FIGS. 3A, 3B, and 3C, the second interlayer connective structure 330 (also serve as the ground plating through hole structure 330) is located in the through hole 306 passing through the insulation portion 202. In some embodiments, the second interlayer connective structure 330 includes a second pillar 332. In some embodiments, the second pillar 232 of the second interlayer connective structure 230 (FIGS. 1A, 1B, and 1C) and the second pillar 332 of the second interlayer connective structure 330 have the same or similar structure.

More specifically, the second interlayer connective structure 330 is located in the through hole 306 passing through the insulation portion 202. Moreover, the second pillar 332 covers and is in contact with the inner wall 306S of the corresponding through hole 306. As shown in FIG. 3B, the through hole 306 has a diameter R9 (which may also serve as the outer diameter of the second pillar 332). In some embodiments, the diameter R9 is in a range of 650 μm to 750 μm, such as about 700 μm.

Similar to the second interlayer connective structure 230, the second pillar 332 of the second interlayer connective structure 330 may have two opposite second end surfaces 332E1 and 332E2. Furthermore, the second end surfaces 332E1 and 332E2 are respectively close to the top surface 202T and the bottom surface 202B of the insulation portion 202. In this embodiment, the second pillar 332 may have a tubular shape and have a through via 316. The through via 316 and the through hole 306 may be substantially coaxial. In addition, the axes of the through via 316 and the through hole 306 may overlap a second pillar axis A332 of the second pillar 332. In some embodiments, the second pillar 332 includes a pair of second end portions 332T1, 332T2 and a second central section 332C. The second end portions 332T1 and 332T2 are respectively close to the top surface 202T and the bottom surface 202B of the insulation portion 202. Furthermore, the second central section 332C is connected between the second end portions 332T1 and 332T2. The second end portions 332T1 and 332T2 respectively have the second end surfaces 332E1 and 332E2.

As shown in FIG. 3B, the tubular second pillar 332 has a second pillar inner diameter R10. In some embodiments, the second pillar inner diameter R10 is in a range of 600 μm to 700 μm, for example, about 650 μm. The outer diameter of the second pillar 332 may be the same as the diameter R9 of the through hole 306. In addition, the outer diameter of the second pillar 332 in a range of 650 μm to 750 μm, for example, about 700 μm.

In some embodiments, wall thicknesses T71 and T72 of the second end portions 332T1 and 332T2 may be greater than a wall thickness T7C of the second central section 232C. The wall thickness T7C shown in FIG. 3C may be the thinnest wall thickness of the second pillar 332. In other words, the thinnest wall thickness (i.e., the wall thickness T7C shown in FIG. 3C) of the second pillar 332 is located at the second central section 332C. In addition, the wall thicknesses T71 and T72 of each of the second end portions 332T1 and 332T2 may decrease gradually from the corresponding second end surface 332E1 and, 332E2 to the second central section 332C, as shown in FIG. 3C. Therefore, the through via 316 has a non-uniform hole diameter. In some embodiments, the wall thicknesses T71, T72 and the wall thicknesses T11, T12, T31, T32 may have the same thickness. In addition, the wall thickness T7C and the wall thicknesses TIC, T3C may have the same thickness. In some embodiments, the minimum value of the wall thicknesses T71, T72 and the wall thickness T7C is, for example, about 25 μm.

As shown in FIGS. 3A, 3B, and 3C, the dielectric material 338 of the circuit board device 500C is located in the second interlayer connective structure 330 and fills the through hole 306 and the through via 316. Furthermore, the second pillar 332 surrounds the dielectric material 338. The first interlayer connective structure 210 is located in the through hole 304 passing through the dielectric material 338. Moreover, the first pillar 212 covers an inner wall 304S of the through hole 304. The through hole 304 and the through hole 306 may be substantially coaxial. In addition, the axes of the through hole 304 and the through hole 306 may overlap the first pillar axis A212 of the first pillar 212 and the second pillar axis A332 of the second pillar 332. The through hole 204 (FIGS. 1B and 1C) and the through hole 304 may have the same diameter R1 (which may also serve as the outer diameter of the first pillar 212). In some embodiments, the diameter of the through hole 304 is in a range of 100 μm to 200 μm, such as about 150 μm. In some embodiments, the through hole 304 is spaced apart from the through hole 306 by a fourth distance LD4. In addition, the fourth distance LD4 is in a range of 225 μm to 325 μm, for example, about 275 μm.

The circuit board arrangement 500C also includes reference layers 320T and 320B. The reference layers 320T and 320B are respectively located on the top surface 202T and the bottom surface 202B of the insulation portion 202. The reference layers 320T and 320B respectively partially cover the top surface 338T and the bottom surface 338B of the dielectric material 338 and extend toward the first interlayer connective structure 210. The reference layers 320T and 320B are respectively spaced apart from the first interlayer connective structures 210 and surround a first number of first interlayer connective structures 210. Furthermore, the reference layers 320T and 320B are respectively connected to a second number of second interlayer connective structures 330 (the first number and the second number are positive integers). In this embodiment, the first number and the second number are both equal to 1.

Similar to reference layers 220T, 220B (FIGS. 1A, 1B, 1C), the reference layers 320T, 320B may have the same size and top view shape as each other. Moreover, the centers (centers of mass) (not shown) of the reference layers 320T and 320B both overlap the first pillar axis A212 of the first pillar 212.

As shown in FIGS. 3A and 3B, the reference layers 320T and 320B have reference layer inner diameters R11 and R12 respectively. In some embodiments, the reference layer inner diameters R11 and R12 have the same numerical value as each other. In addition, the reference layer inner diameters R11 and R12 are in a range of 475 μm to 525 μm, for example, about 500 μm.

As shown in FIGS. 1A and 1B, the reference layer outer diameters of the reference layers 320T and 320B may be the same as the diameter R9 of the through hole 306. In some embodiments, the reference layer outer diameter of the reference layers 320T, 320B is in a range of 650 μm to 750 μm, for example, about 700 μm. In some embodiments, a radial width W2 (W2=0.5*(R9−R11) or W2−0.5*(R9−R12)) of the reference layers 320T, 320B is in a range of 75 μm to 125 μm, for example, about 100 μm.

In some embodiments, the first interlayer connective structure 210 may further include a seed layer 211 located within the through hole 304. The reference layers 320T, 320B may further include a seed layer 319 between them and the top surface 202T and the bottom surface 202B of the insulation portion 202. The second interlayer connective structure 230 may further include a seed layer 331 located within the through hole 206.

Figure 4:
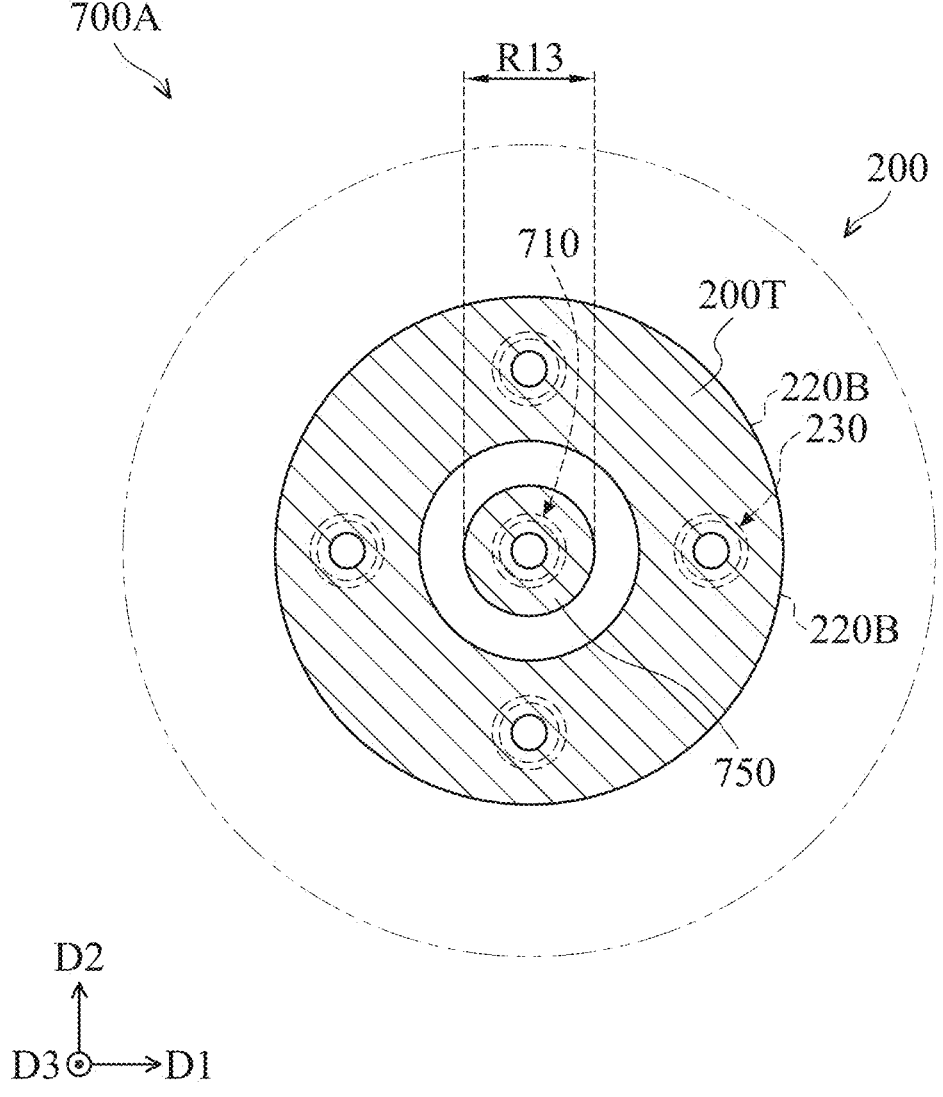
FIG. 4 is a schematic top view showing an interlayer connective structure of a printed circuit board of a comparative example.
Figure 5:
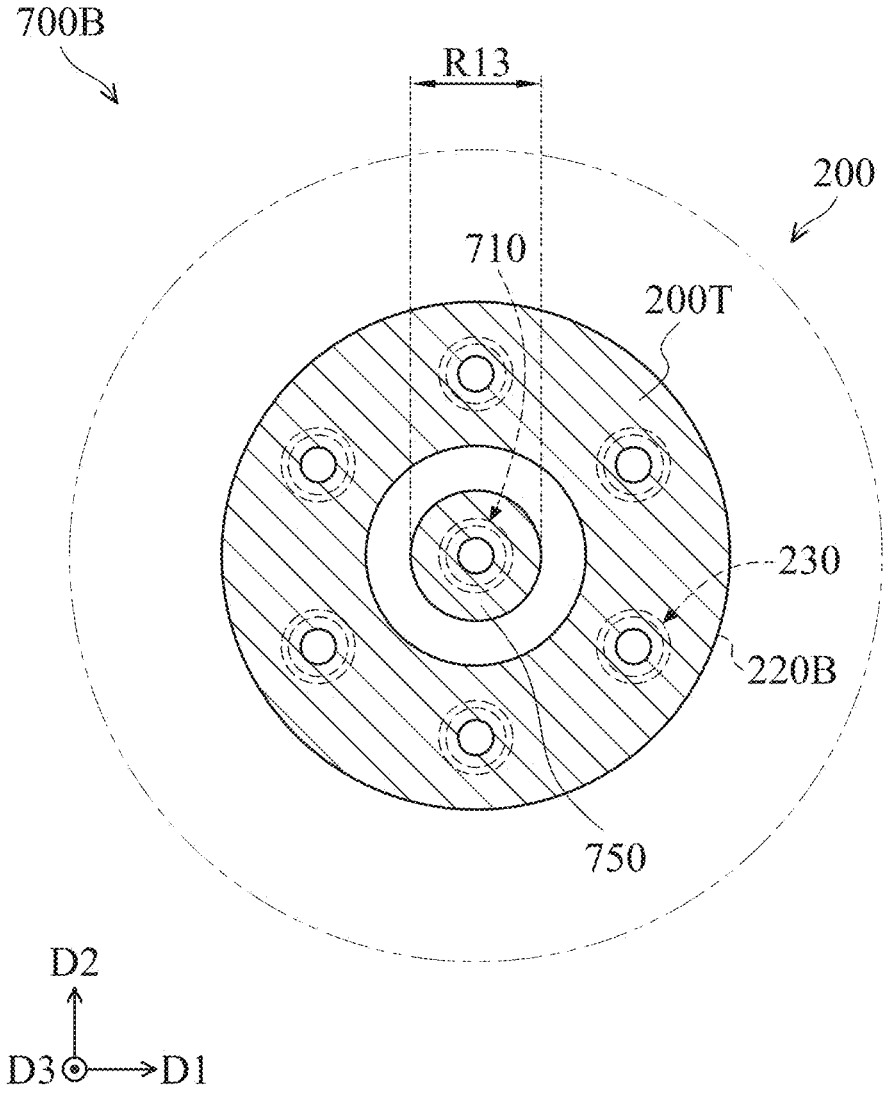
FIG. 5 is a schematic top view showing an interlayer connective structure of a printed circuit board of a comparative example.
Figure 6:
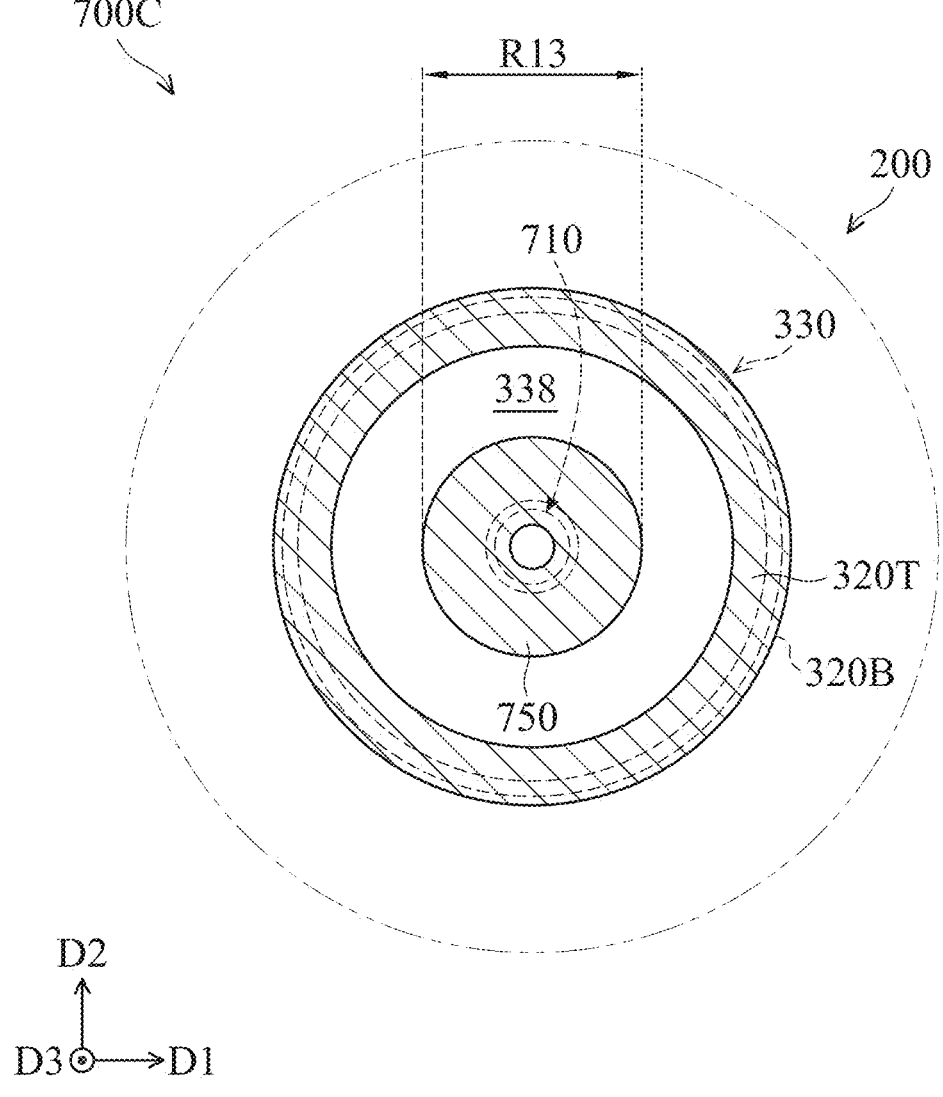
FIG. 6 is a schematic top view showing an interlayer connective structure of a printed circuit board of a comparative example.
Figure 7:
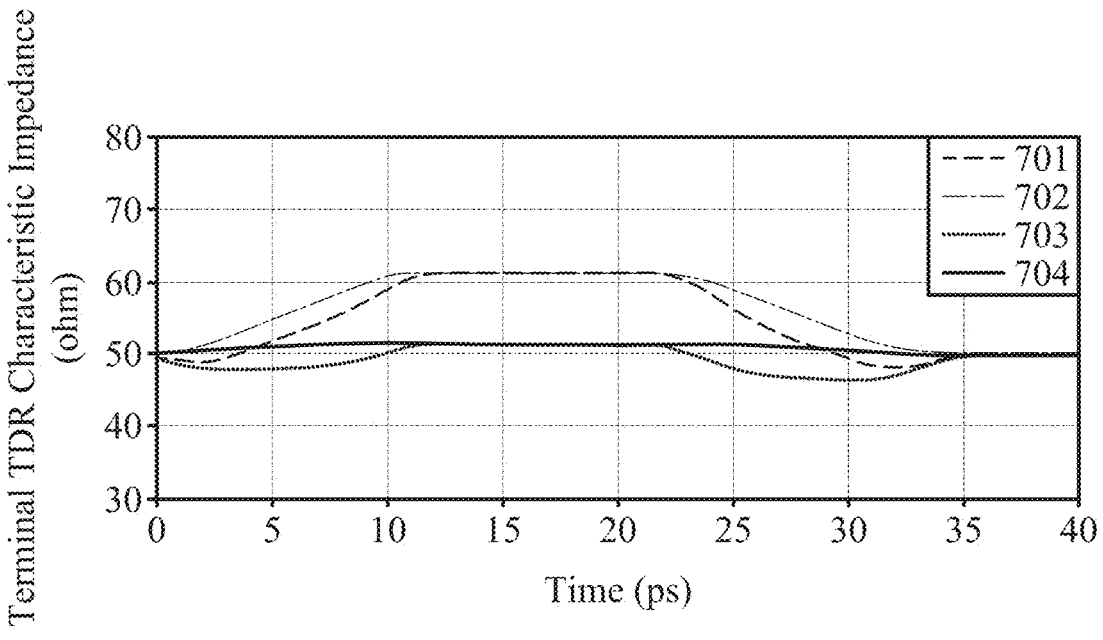
FIG. 7 is a diagram showing the comparison of the simulations of terminal time-domain reflectometry (TDR) characteristic impedance versus signal transmission time between an interlayer connective structure of a circuit board device in accordance with one embodiment of the disclosure and an interlayer connective structure of a printed circuit board of a comparative example.
Figure 8:
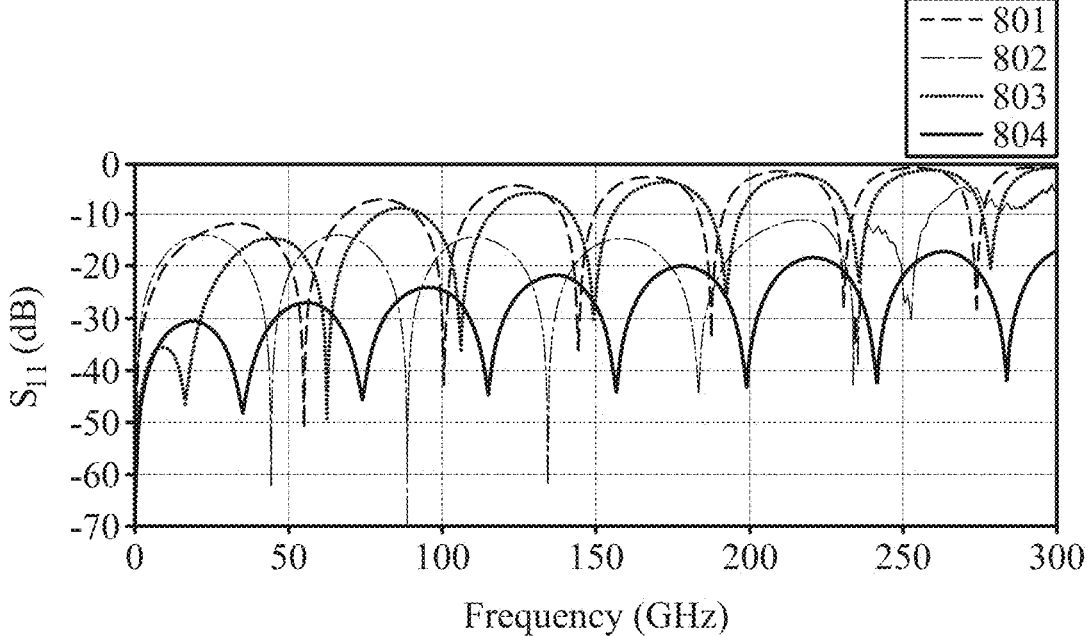
FIG. 8 is a diagram showing the comparison of the simulations of reflection coefficient (return loss, $S_{11}$ (dB)) versus signal frequency (GHz) between an interlayer connective structure of a circuit board device in accordance with one embodiment of the disclosure and an interlayer connective structure of a printed circuit board of the comparative example.
Figure 9:
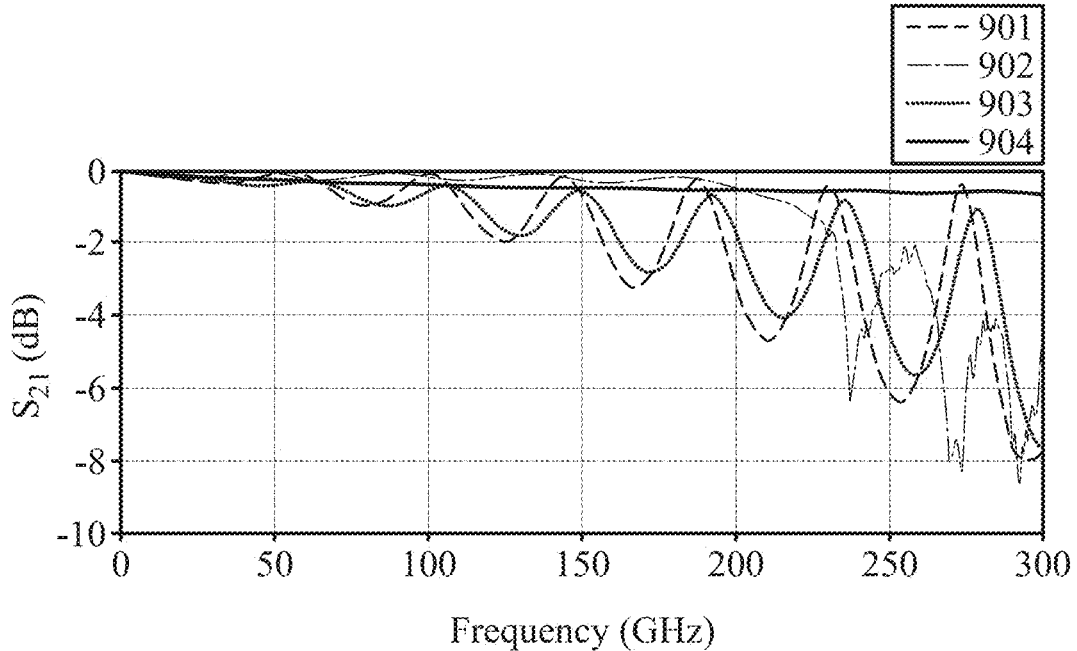
FIG. 9 is a diagram showing the comparison of the simulations of insertion loss ($S_{21}$ (dB)) versus signal frequency (GHz) between an interlayer connective structure of a circuit board device in accordance with one embodiment of the disclosure and an interlayer connective structure of a printed circuit board of the comparative example.

The comparison of the simulations of terminal time-domain reflectometry (TDR) characteristic impedance versus signal transmission time, reflection coefficient (return loss, $S_{11}$ (dB)) versus signal frequency (GHz) and insertion loss ($S_{21}$ (dB)) versus signal frequency (GHz) between the interlayer connective structures of the circuit board devices 500A, 500B and 500C in accordance with some embodiments of the disclosure and interlayer connective structures of printed circuit boards 700A, 700B, 700C of comparative examples shown in FIGS. 4, 5 and 6 will be described with reference to FIGS. 7, 8 and 9. The reference numbers of the printed circuit boards 700A, 700B, 700C of the comparative examples shown in FIGS. 4, 5 and 6 that are the same or similar to those in FIGS. 1A, 1B, 1C, 2, 3A, 3B, and 3C denote the same or similar elements. The difference between the interlayer connective structures of the printed circuit boards 700A, 700B, and 700C of the comparative examples (including the signal plating through hole structure surrounded by 4 ground plating through hole structures (the second interlayer connective structure 230) shown in FIG. 4; the signal plating through hole structure surrounded by 6 ground plating through hole structures (the second interlayer connective structures 230) shown in FIG. 5; and the coaxial perforated structure formed by the signal plating through hole structure surrounded by the ground plating through hole structure (the second interlayer connective structure 330) shown in FIG. 6) and the interlayer connective structures of the circuit board devices 500A, 500B, and 500C in accordance with some embodiments of the disclosure is at least opposite end surfaces of the interlayer connective structures 710 (also called signal plating through hole structures 710) of the printed circuit boards 700A, 700B, and 700C of the comparative examples for transmitting signals are directly covered by and directly connected to pads 750. In addition, the top surfaces of the pads 750 forms portions of the upper surface and portions of the lower surface of the printed circuit boards 700A, 700B, and 700C of the comparative examples. On the other hand, the first interlayer connective structure 210 for transmitting signals (also serve as the signal plating through hole structure 210) of the circuit board devices 500A, 500B, and 500C in accordance with one embodiment of the disclosure has a pad-free design, the opposite first end surfaces 212E1 and 212E2 of the first interlayer connective structure 210 are exposed from the substrate 200 and form portions of the upper surface and portions of the lower surface of the circuit board devices 500A, 500B, and 500C. A diameter R13 of the pads 750 of the printed circuit boards 700A, 700B, and 700C of the comparative examples is in a range of 300 μm to 400 μm, for example, about 350 μm.

FIG. 7 is a diagram showing the comparison of the characteristic simulation curves of terminal time-domain reflectometry (TDR) characteristic impedance (ohm) versus signal transmission time (ps) between the interlayer connective structures of the circuit board devices 500A, 500B and 500C in accordance with some embodiments of the disclosure and the interlayer connective structures of printed circuit boards 700A, 700B, 700C of the comparative examples.

In FIG. 7, the curve 701 shows the characteristic curve of the terminal TDR characteristic impedance versus the signal transmission time of the interlayer connective structure 710 connected to the pads 750 in the printed circuit boards 700A and 700B of the comparative examples (that is, the interlayer connective structure 710 surrounded by 4 or 6 ground plating through hole structures and connected to the pads 750 has the same terminal TDR characteristic impedance performance). The curve 702 shows the characteristic curve of the terminal TDR characteristic impedance versus the signal transmission time of the pad-free interlayer connective structure (the first interlayer connective structure) 210 for transmitting signals in the plating through hole structure of the circuit board devices 500A and 500B in accordance with some embodiments of the disclosure (that is, the interlayer connective structure (the first interlayer connective structure) 210 surrounded by 4 or 6 ground plating through hole structures has the same characteristic impedance performance). The curve 703 shows the characteristic curve of the terminal TDR characteristic impedance versus the signal transmission time of the interlayer connective structure 710 connected to the pads 750 in the coaxial via structure of the printed circuit board 700C of the comparative example. The curve 704 shows the characteristic curve of the terminal TDR characteristic impedance versus the signal transmission time of the pad-free interlayer connective structure (the first interlayer connective structure) 210 for transmitting signals in the coaxial via structure of the circuit board device 500C in accordance with one embodiment of the disclosure.

It can be seen from the curves 701 and 702 that in the signal plating through hole structure surrounded by the ground plating through hole structures, the conductive path that transmits signals and defined by the signal plating through hole structure having a pad-free design (the curve 702) may have fewer interfaces, thereby having better impedance matching (impedance continuity). It can be seen from the curves 703 and 704 that in the coaxial via structure, the conductive path that transmits signals and defined by the signal plating through hole structure having a pad-free design (the curve 704) may have fewer interfaces, thereby having better impedance matching (impedance continuity). It can be seen from the curves 701, 702, 703, and 704 that compared to the signal plating through hole structure surrounded by the ground plating through hole structures (the curves 701, 702), the impedance of the signal plating through hole structure of the coaxial via structure (the curves 703, 704) is closer to the target impedance (usually of about 50 ohms). Moreover, the signal plating through hole structure in the coaxial via structure having a pad-free design (the curve 704) has the best impedance matching (impedance continuity), and its characteristic impedance is closest to the target impedance of about 50 ohms.

FIG. 8 is a diagram showing the comparison of the characteristic simulation curves of reflection coefficient (return loss, Su (dB)) versus signal frequency (GHz) between the interlayer connective structures of the circuit board devices 500A, 500B and 500C in accordance with some embodiments of the disclosure and the interlayer connective structures of printed circuit boards 700A, 700B, 700C of the comparative examples, wherein the signal frequency is in a range of about 1 GHz to 300 GHz.

In FIG. 8, the curve 801 shows the characteristic curve of the reflection coefficient ($S_{11}$ (dB)) versus the signal frequency (GHz) of the interlayer connective structure 710 connected to the pads 750 in the printed circuit boards 700A and 700B of the comparative example (that is, the interlayer connective structure 710 surrounded by 4 or 6 ground plating through hole structures and connected to the pads 750 has the same reflection coefficient performance). The curve 802 shows the characteristic curve of the reflection coefficient versus the signal frequency (GHz) of the pad-free interlayer connective structure (the first interlayer connective structure) 210 for transmitting signals in the plating through hole structure of the circuit board devices 500A and 500B in accordance with some embodiments of the disclosure (that is, the interlayer connective structure (the first interlayer connective structure) 210 surrounded by 4 or 6 ground plating through hole structures has the same reflection coefficient performance). The curve 803 shows the characteristic curve of the reflection coefficient versus the signal frequency of the interlayer connective structure 710 connected to the pads 750 in the coaxial via structure of the printed circuit board 700C of the comparative example. The curve 804 shows the characteristic curve of the reflection coefficient versus the signal frequency of the pad-free interlayer connective structure (the first interlayer connective structure) 210 for transmitting signals in the coaxial via structure of the circuit board device 500C in accordance with one embodiment of the disclosure.

It can be seen from the curves 801 and 802 that in the signal plating through hole structure surrounded by the ground plating through hole structures, the signal plating through hole structure having a pad-free design (the curve 702) has a lower reflection coefficient. It can be seen from the curves 803 and 804 that in the coaxial via structures, the signal plating through hole structure having a pad-free design (the curve 704) has a lower reflection coefficient. It can be seen from the curves 801, 802, 803, and 804 that the pad-free signal plating through hole structure in the coaxial via structure (the curve 804) has a reflection coefficient of less than-15 dB at the signal frequency of about 1 GHz to 300 GHz. The reflection coefficient of the pad-free signal plating through hole structure in the coaxial via structure (the curve 804) at high frequency (about 300 GHz) is about 10 dB lower than the transition region of the printed circuit board in the comparative example (the curve 801), which can improve the signal reflection loss at high frequencies (about 300 GHz).

FIG. 9 is a diagram showing the comparison of the characteristic simulation curves of insertion loss ($S_{21}$ (dB)) versus signal frequency (GHz) between the interlayer connective structures of the circuit board devices 500A, 500B and 500C in accordance with some embodiments of the disclosure and the interlayer connective structures of printed circuit boards 700A, 700B, 700C of the comparative examples, wherein the signal frequency is in a range of 1 GHz to 300 GHz.

In FIG. 9, the curve 901 shows the characteristic curve of the insertion loss versus the signal frequency (GHz) of the interlayer connective structure 710 connected to the pads 750 in the printed circuit boards 700A and 700B of the comparative example (that is, the interlayer connective structure 710 surrounded by 4 or 6 ground plating through hole structures and connected to the pads 750 has the same insertion loss performance). The curve 902 shows the characteristic curve of the insertion loss versus the signal frequency of the pad-free interlayer connective structure (the first interlayer connective structure) 210 for transmitting signals in the plating through hole structure of the circuit board devices 500A and 500B in accordance with some embodiments of the disclosure (that is, the interlayer connective structure (the first interlayer connective structure 210 surrounded by 4 or 6 ground plating through hole structures has the same insertion loss performance). The curve 903 shows the characteristic curve of the insertion loss versus the signal frequency of the interlayer connective structure 710 connected to the pads 750 in the coaxial via structure of the printed circuit board 700C of the comparative example. The curve 904 shows the characteristic curve of the insertion loss versus the signal frequency of the pad-free interlayer connective structure (the first interlayer connective structure) 210 for transmitting signals in the coaxial via structure of the circuit board device 500C in accordance with one embodiment of the disclosure.

It can be seen from the curves 901 and 903 that the insertion loss curves of the signal plating through hole structures connected to the pads 750 in the printed circuit boards 700A, 700B, and 700C of the comparative examples will produce periodic resonance phenomenon when the signal frequency is above 50 GHz. In each of the curves 901 and 903, the jitter amplitude of the waveform becomes larger as the frequency increases. Compared with the signal plating through hole structure in the coaxial via structure and connected to the pads (e.g., the printed circuit board 700C of the comparative example), the signal plating through hole structures surrounded by the ground plating through hole structures and connected to the pads (e.g., the printed circuit boards 700A, 700B of the comparative examples) has larger jitter amplitude of the waveform of the insertion loss curve. It can be seen from the curves 901, 902, 903, and 904 that in the coaxial via structure and the signal plating through hole structure that is surrounded by the ground plating through hole structures, the pad-free signal plating through hole structure (the curves 902, 904) may improve the jitter amplitude of the waveform of the insertion loss curve and have lower insertion loss. In the signal plating through hole structure surrounded by the ground plating through hole structures, the insertion loss curve of the pad-free signal plating through hole structure (the curve 902) will not produce periodic resonance until the signal frequencies is above 235 GHZ (for example, the curve 902 produces periodic resonance phenomenon at the signal frequencies of about 235, 270, 290 GHz). Moreover, the pad-free signal plating through hole structure in the coaxial via structure (the curve 904) does not find the periodic resonance phenomenon in the insertion loss curve at high signal frequencies (the signal frequency is up to about 300 GHz). The pad-free signal plating through hole structure in the coaxial via structure (the curve 904) may maintain low insertion loss performance at the signal frequency of about 1 GHz to 300 GHz.

Embodiments of the disclosure provide a circuit board device for transmitting signals at a frequency of 50 GHz to 300 GHz. The circuit board device includes an insulation portion, a first interlayer connective structure, a first reference layer, a second reference layer and a second interlayer connective structure. The first conductive structure defining the signal path has a pad-free design. That is to say, the two first end surfaces of the first conductive structure that passes through the insulation portion are not directly covered by or directly connected to the pads. In other words, the opposite upper and lower surfaces of the circuit board device respectively include opposite first end surfaces. Moreover, the through hole of the first via structure is not sealed by the pads. In some embodiments, the first conductive structure includes a first pillar. Furthermore, the first pillar includes a pair of first end portions and a first central section. In some embodiments, the first wall thickness of the first end portion is greater than a second wall thickness of the first central section. The first reference layer and the second reference layer are located on the top and bottom surfaces of the insulation portion. The first reference layer and the second reference layer are separated from the first interlayer connective structure and surround the first interlayer connective structure. The second interlayer connective structure passes through the insulation portion. Furthermore, two opposite second end surfaces of the second interlayer connective structure are respectively connected to the first reference layer and the second reference layer to define a ground path. The ground path surrounds the signal path.

In some embodiments, the first interlayer connective structure and the second interlayer connective structure of the circuit board device may form a signal plating through hole structure surrounded by at least one ground plating through hole structure. In this embodiment, the range of the number of first interlayer connective structure is equal to 1. The range of the number of second interlayer connective structure may be greater than or equal to 4. In some embodiments, the first interlayer connective structure and the second interlayer connective structure of the circuit board device may form a coaxial via structure. In this embodiment, the range of the number of first interlayer connective structure and the second interlayer connective structure are both equal to 1.

In some embodiments, the outer diameter and the wall thickness of the first pillar of the first interlayer connective structure, the outer diameter and the wall thickness of the second pillar of the second interlayer connective structure, the inner and outer diameters of the first reference layer and the second reference layer, the diameters of the first through hole accommodating the first interlayer connective structure and the second through hole accommodating the second interlayer connective structure and distance between the first through hole and the second through hole may be selected according to the process ability and electrical analysis results to further improve the impedance matching with the transmission line, the reflection coefficient and the insertion loss.

Since the circuit board device in accordance with one embodiment of the disclosure includes the signal plating through hole structure having a pad-free design, the conductive path for transmitting signals and defined by the pad-free signal plating through hole structure has fewer interfaces. The conductive path may be formed with low variation of impedance. The impedance matching (impedance continuity) with the transmission line can be improved. The return loss due to the impedance mismatch when transmitting high-frequency signals can be reduced. Moreover, the pad-free signal plating through hole structure in the coaxial via structure has the best impedance matching (impedance continuity), and its characteristic impedance is closest to the target impedance of about 50 ohms. In addition, the pad-free signal plating through hole structure of the circuit board device in accordance with one embodiment of the disclosure has a lower reflection coefficient. Moreover, the pad-free signal plating through hole structure in the coaxial via structure has a reflection coefficient of less than about-15 dB at the signal frequency of about 1 GHz to 300 GHz. The reflection coefficient of the pad-free signal plating through hole structure in the coaxial via structure at high frequency (about 300 GHz) is about 10 dB lower than the transition region of the printed circuit board in the comparative example, which can improve the signal reflection loss at high frequencies (about 300 GHz). In addition, the signal plating through hole structure having a pad-free design in accordance with one embodiment of the disclosure may improve the jitter amplitude of the waveform of the insertion loss curve and have lower insertion loss. In the signal plating through hole structure surrounded by the ground plating through hole structures, the insertion loss curve of the pad-free signal plating through hole structure will not produce periodic resonance until the signal frequencies is above 235 GHz. Moreover, the pad-free signal plating through hole structure in the coaxial via structure does not find the periodic resonance phenomenon in the insertion loss curve at high signal frequencies (the signal frequency is up to about 300 GHz). The pad-free signal plating through hole structure in the coaxial via structure may maintain low insertion loss performance at the signal frequency of about 1 GHz to 300 GHz. The circuit board device in accordance with one embodiment of the disclosure may have a reduced loss during current signal transmission. Therefore, the signal transmission quality of the circuit board can be improved.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A circuit board device for transmitting signals at a frequency of 50 GHz to 300 GHz, comprising:
   an insulation portion having a top surface and a bottom surface;
   a first interlayer connective structure passing through the insulation portion to define a signal path, wherein the first interlayer connective structure comprises:
      a first pillar passing through the insulation portion and having two opposite first end surfaces, wherein the first pillar comprises:
         a pair of first end portions having respective first end surfaces; and
         a first central section connected between the first end portions, wherein a first wall thickness of each of the first end portions is greater than a second wall thickness of the first central section;
   a first reference layer located on the top surface of the insulation portion, wherein the first reference layer is separated from the first interlayer connective structure and surrounds the first interlayer connective structure;
   a second reference layer located on the bottom surface of the insulation portion, wherein the second reference layer is separated from the first interlayer connective structure and surrounds the first interlayer connective structure; and
   at least one second interlayer connective structure passing through the insulation portion, wherein two opposite second end surfaces of the second interlayer connective structure are respectively connected to the first reference layer and the second reference layer to define a ground path that surrounds the signal path, wherein an upper surface and a lower surface of the circuit board device comprise the respective first end surfaces.

2. The circuit board device as claimed in claim 1, wherein in a top view, the first reference layer and the second reference layer are annular and completely overlap each other, and a first circle center of the first reference layer and a second circle center of the second reference layer both overlap a first pillar axis of the first pillar.

3. The circuit board device as claimed in claim 1, wherein the first pillar has a tubular shape and has a first pillar inner diameter, and the first pillar inner diameter is in a range of 50 μm to 150 μm.

4. The circuit board device as claimed in claim 1, wherein the minimum value of the first wall thickness and the minimum value of the second wall thickness are each 25 μm.

5. The circuit board device as claimed in claim 1, wherein the second interlayer connective structure comprises:
   a second pillar passing through the insulation portion, wherein the second pillar comprises:
      a pair of second end portions having respective second end surfaces; and
      a second central section connected between the second end portions, wherein a third wall thickness of each of the second end portions is greater than a fourth wall thickness of the second central section.

6. The circuit board device as claimed in claim 5, wherein the minimum value of the third wall thickness and the minimum value of the fourth wall thickness are both 25 μm.

7. The circuit board device as claimed in claim 5, wherein:
   each of the first interlayer connective structure and the second interlayer connective structure is a plating through hole structure, the first interlayer connective structure is located in a first through hole passing through the insulation portion, and the first pillar covers an inner wall of the first through hole; and
   the second interlayer connective structure is located in a second through hole passing through the insulation portion, and the second pillar covers an inner wall of the second through hole.

8. The circuit board device as claimed in claim 7, wherein the first through hole has a first diameter, and the first diameter is in a range of 100 μm to 200 μm.

9. The circuit board device as claimed in claim 7, wherein the second through hole has a second diameter, and the second diameter is in a range of 100 μm to 200 μm.

10. The circuit board device as claimed in claim 7, wherein the second through hole has a second diameter, and the second diameter is in a range of 100 μm to 200 μm.

11. The circuit board device as claimed in claim 7, wherein the first reference layer and the second reference layer respectively have a first reference layer inner diameter and a second reference layer inner diameter, and the first reference layer inner diameter and the second reference layer inner diameter are in a range of 500 μm to 600 μm.

12. The circuit board device as claimed in claim 11, wherein the first reference layer and the second reference layer respectively have a first reference layer outer diameter and a second reference layer outer diameter, and the first reference layer outer diameter and the second reference layer outer diameter are in a range of 1200 μm to 1300 μm.

13. The circuit board device as claimed in claim 7, wherein the first through hole is spaced apart from the second through hole by a first distance, and the first distance is in a range of 250 μm to 350 μm.

14. The circuit board device as claimed in claim 7, wherein in a top view, the second through hole is spaced apart from a first inner edge of the first reference layer by a second distance, and the second distance is in a range of 50 μm to 150 μm.

15. The circuit board device as claimed in claim 7, wherein in a top view, the second through hole is spaced apart from a first outer edge of the first reference layer by a third distance, and the third distance is in a range of 50 μm to 150 μm.

16. The circuit board device as claimed in claim 7, wherein the first reference layer and the second reference layer surround a first number of first interlayer connective structures, and the first reference layer and the second reference layer are connected to a second number of second interlayer connective structures, wherein the first number is equal to 1, and the second number is greater than or equal to 4.

17. The circuit board device as claimed in claim 16, wherein second through-hole axes of the second through holes are located on a circle whose center is located at a first through-hole axis of the first through hole, and a central angle between two radii connecting the second through-hole axes of the two closest second through holes to the first through-hole axis of the first through hole is less than or equal to 90 degrees.

18. The circuit board device as claimed in claim 5, wherein the first interlayer connective structure and the second interlayer connective structure form a coaxial via structure, and the second interlayer connective structure is located in a third through hole passing through the insulation portion, wherein the second pillar covers an inner wall of the third through hole, and the coaxial via structure further comprises:
   a first dielectric material filling the third through hole, wherein the second pillar surrounds the first dielectric material, and the first interlayer connective structure is located in a fourth through hole passing through the first dielectric material.

19. The circuit board device as claimed in claim 18, wherein the first reference layer and the second reference layer respectively partially cover a top surface and a bottom surface of the first dielectric material.

20. The circuit board device as claimed in claim 18, wherein the first reference layer and the second reference layer surround a first number of first interlayer connective structures, and the first reference layer and the second reference layer are connected to a second number of second interlayer connective structures, wherein the first number and the second number are both equal to 1.

21. The circuit board device as claimed in claim 18, wherein the third through hole and the fourth through hole are substantially coaxial.

22. The circuit board device as claimed in claim 18, wherein the third through hole has a third diameter, and the third diameter is in a range of 650 μm to 750 μm.

23. The circuit board device as claimed in claim 18, wherein the fourth through hole has a fourth diameter, and the third diameter is in a range of 650 μm to 750 μm.

24. The circuit board device as claimed in claim 18, wherein the second pillar has a tubular shape and has a second pillar inner diameter, and the second pillar inner diameter is in a range of 600 μm to 700 μm.

25. The circuit board device as claimed in claim 18, wherein the second pillar has a tubular shape and has a second pillar inner diameter, and the second pillar inner diameter is in a range of 600 μm to 700 μm.

26. The circuit board device as claimed in claim 25, wherein each of the first reference layer and the second reference layer has a reference layer outer diameter, and the reference layer outer diameter is in a range of 650 µm to 750 µm.

27. The circuit board device as claimed in claim 18, wherein the third through hole is spaced apart from the fourth through hole by a fourth distance, and the fourth distance is in a range of 225 µm to 325 µm.

28. The circuit board device as claimed in claim 18, wherein an impedance of the coaxial via structure is in a range of 45 ohms to 55 ohms.

29. The circuit board device as claimed in claim 1, wherein a thickness of the insulation portion is in a range of 2.09 mm to 2.29 mm.

\* \* \* \* \*